United States Patent

Yuba et al.

[11] Patent Number: 6,090,525
[45] Date of Patent: Jul. 18, 2000

[54] ACTINIC RADIATION SENSITIVE POLYMER COMPOSITION

[75] Inventors: Tomoyuki Yuba; Yoshihiro Ishikawa; Masaya Asano, all of Shiga-ken, Japan

[73] Assignee: Toray Industries, Inc., Japan

[21] Appl. No.: 09/080,664

[22] Filed: May 18, 1998

[30] Foreign Application Priority Data

May 16, 1997 [JP] Japan ................................. 9-127706

[51] Int. Cl.$^7$ ........................................................ G03F 7/037
[52] U.S. Cl. ...................... 430/283.1; 430/195; 430/197; 430/281.1; 525/426
[58] Field of Search .................................. 430/195, 197, 430/283.1, 281.1; 525/426

[56] References Cited

U.S. PATENT DOCUMENTS 4,565,767  1/1986  Kataoka et al. ......................... 430/196
5,442,024  8/1995  Kunimune et al. ....................... 528/12

FOREIGN PATENT DOCUMENTS

0 065 352 A2  11/1982  European Pat. Off. .
0 430 221 A2   6/1991  European Pat. Off. .
0 547 555 A2   6/1993  European Pat. Off. .

*Primary Examiner*—Cynthia Hamilton
*Attorney, Agent, or Firm*—Morrison & Foerster

[57] ABSTRACT

An actinic radiation sensitive polymer composition containing
(a) a polyimide precursor obtainable by the interaction of an amine compound having a photocrosslinking group with carboxyl groups of a poly(amic acid) chain, and
(b) a photoinitiator and/or photosensitizer,
in which the degree of imidization Ia is $0.03 \leq Ia \leq 0.6$, has the characteristic features of both good stability of viscosity with lapse of time and good photosensitive performance.

15 Claims, 1 Drawing Sheet

Fig. 1

ACTINIC RADIATION SENSITIVE POLYMER COMPOSITION

TECHNICAL FIELD

The present invention relates to an actinic radiation sensitive polymer composition and, more particularly, it relates to a photosensitive polyimide coating agent composition with both good viscosity stability at room temperature with lapse of time and good photosensitive performance.

BACKGROUND ART

Since photosensitive polyimides themselves possess pattern processability, process simplification is possible when compared with the pattern processing of an ordinary non-photosensitive polyimide using a resist, etc. Hence, they are currently is widely put to practical use as semiconductor protective films and insulating films, etc.

In the semiconductor industry, for the purposes of stabilizing the film-forming process, photosensitive polyimides having good stability with lapse of time are in demand.

Of the photosensitive polyimides employed in connection with semiconductors, those which include a poly(amic acid) structure undergo a lowering of viscosity due to hydrolysis of the polymer, etc, and so cannot be said to be sufficiently stable over time.

Surprisingly, we have found that a composition, with both good viscosity stability at room temperature with lapse of time and good photosensitive performance; is attainable, by controlling the poly(amic acid) degree of imidization and the number of photocrosslinking groups.

The problem addressed by this invention lies in providing an actinic radiation sensitive polymer composition with both good viscosity stability at room temperature with lapse of time and good photosensitive performance.

SUMMARY OF THE INVENTION

A solution to the problem can be realised, in accordance with the invention, by adopting the following composition.

Specifically, the present invention provides an actinic radiation sensitive polymer composition comprising (a) a polyimide precursor obtained by the interaction of an amine compound having a photocrosslinking group with carboxyl groups of a poly (amic acid), and (b) a photoinitiator and/or photosensitizer, in which the degree of imidization Ia of the polyimide precursor is $0.03 \leq Ia \leq 0.6$.

In the actinic radiation sensitive polymer composition of the present invention, preferably the poly(amic acid) is a polymer comprising structural units represented by general formula (1)

(1)

and additionally comprising structural units represented by general formulae:

(2)

and/or (3)

(where $R^1$ is a 3- or 4-valent organic group with at least two carbon atoms, $R^2$ is a divalent organic group with at least 2 carbon atoms and k is 0 or 1), and the amine compound is a compound represented by general formula (4)

(4)

(where $R^3$, $R^4$ and $R^5$ independently each represent hydrogen or an organic group with from 1 to 30 carbons, of which at least one is an organic group with a photocrosslinking group).

PREFERRED EMBODIMENTS OF THE INVENTION

Hereinafter, the types of groups of formula (1) and the partially and completely imidized groups thereof of the formulae (2) and (3) respectively will be referred to merely in the terms of the group represented by formula (1).

Embodiments of the present invention will now be described in detail with reference to the accompanying drawing, referred to as FIG. 1, which is an outline drawing illustrating the method for determining the absorbance arising from the imide groups in an IR spectrum, which imide groups have the formula (5).

(5)

The polyimide precursor in an actinic radiation sensitive polymer composition of the present invention denotes a polymer obtainable by the interaction of an amine compound having a photocrosslinking group and carboxyl groups of a poly(amic acid) and which, for example, by heating or by means of a suitable catalyst, can form a polymer (hereinafter referred to as the polyimide polymer) with imide rings and other cyclic structures.

Typically, it denotes a polymer formed by the addition to a poly(amic acid) with a structure of the type shown in the abovementioned general formula (1) of an amine compound with a structure as shown in the abovementioned general formula (4). Preferably, at least 50 mol % of the poly (amic acid) units are of the general formula (1).

In the abovementioned general formula (1), $R^1$ is a trivalent or tetravalent organic group having at least two carbon atoms. In order to obtain a polyimide polymer with outstanding heat resistance, RI is preferably a trivalent or tetravalent group with from 6 to 30 carbons and containing an aromatic ring or an aromatic heterocyclic ring. More preferably, it contains an aromatic ring. Preferred specific examples of $R^1$ are the residual groups of 3,3',4,4'-biphenyltetracarboxylic acid, 3,3',4,4'-diphenylethertetra carboxylic acid, 3,3',4,4'-diphenylhexafluoropropanetetracarboxylic acid, 3,3',4,4'-benzophenonetetracarboxylic acid, 3,3',4,4'-diphenylsulphonetetracarboxylic acid, pyromellitic acid, butanetetracarboxylic acid and cyclopentanetetra-carboxylic acid. Particularly preferred specific examples for obtaining polyimide polymer with outstanding heat resistance are the residual groups of 3,3',4,4'-biphenyltetracarboxylic acid, 3,3',4,4-diphenyl-ethertetracarboxylic acid, 3,3',4,4'-diphenylhexa-fluoropropa netetracarboxylic acid, 3,3',4,4'-benzo-phenonetetracarboxylic acid, 3,3',4,4-diphenylsulphone-tetracarboxylic acid and pyromellitic acid.

The polymer in a composition of the present invention may be a homopolymer and may contain only one type of $R^1$ from amongst the abovementioned organic groups, or it may be a copolymer containing two or more types.

In the above general formula (1), $R^2$ is a divalent organic group with at least two carbon atoms. In order to obtain a polyimide polymer with outstanding heat resistance, $R^2$ is preferably a divalent group with from 6 to 35 carbons and containing an aromatic ring or aromatic heterocyclic ring. More preferably it contains an aromatic ring. The residual groups of the following compounds can be given as preferred specific examples of $R^2$:

phenylenediamine, methylphenylenediamine, dimethylphenylenediamine, trimethylphenylenediamine, tetramethyl-phenylenediamine, trifluoromethylphenylenediamine, bis-(trifluoro)methylphenylenediamine, methoxyphenylenedi-amine, trifluoromethoxyphenylenediamine, fluorophenylenediamine, chlorophenylenediamine, bromophenylenediamine, carboxyphenylenediamine, methoxycarbonylphenylene-diamine, diaminodiphenylmethane, bis(aminomethylphenyl)-methane, bis(aminotrifluoromethylphenyl)methane, bis-(aminoethylphenyl)methane, bis (aminochlorophenyl)-methane, bis(aminodimethylphenyl)methane, bis(amino-diethylphenyl)methane, diaminodiphenylpropane, bis (amino-methylphenyl)propane, bis (aminotrifluoromethylphenyl)-propane, bis (aminoethylphenyl)propane, bis(aminochlorophenyl) propane, bis(aminodimethylphenyl)propane, bis (aminodiethylphenyl)propane, diaminodiphenylhexafluoropropane, bis(aminomethylphenyl)hexafluoropropane, bis(aminotrifluoromethylphenyl)hexafluoropropane, bis (aminoethylphenyl)hexafluoropropane, bis(aminodimethylphenyl)hexafluoropropane, bis(aminodiethylphenyl)hexafluoropropane, diaminodiphenylsulphone, (aminomethylphenyl)sulphone, bis(aminoethylphenyl)sulphone, bis (aminotrifluoromethylphenyl)sulphone, bis(aminodimethylphenyl)sulphone, bis (aminodiethylphenyl)sulphone, di-aminodiphenyl ether, bis(aminomethylphenyl)ether, bis-(aminotrifluoromethylphenyl)ether, bis(aminoethylphenyl)-ether, bis(aminodimethylphenyl)ether, bis (aminodiethylphenyl)ether, dimethylbenzidine, bis (trifluoro-methyl)benzidine, dichlorobenzidine, bis (aminophenoxy)-benzene, bis(aminophenoxyphenyl) propane, bis(amino-phenoxyphenyl)hexafluoropropane, bis (aminophenoxy-phenyl)ether, bis(aminophenoxyphenyl) methane and bis-(aminophenoxyphenyl)sulphone.

The polymer in a composition of the present invention may contain only one type of $R^2$ from amongst the abovementioned organic groups, or it may be a copolymer containing two or more types.

Furthermore, in order enhance the adhesion properties of the polyimide polymer, it is preferred that from 3 to 20 mol % of $R^2$ be an aliphatic group with a siloxane linkage. If this range is exceeded, the stability of the viscosity with lapse of time and the heat resistance of the polymer may be impaired. Furthermore, with less than this range, care is required since sufficient adhesive strength may not be manifested. Preferred specific examples are bis(3-aminopropyl) tetramethyldisiloxane, bis(4-aminophenyl) tetramethyldisiloxane and bis($\alpha$,$\omega$-aminopropyl) permethylpolysiloxane.

In the above general formula (4), $R^3$, $R^4$ and $R^5$ independently each represent hydrogen or an organic group with from 1 to 30 carbons, of which at least one is an organic group with photocrosslinkability. In the case where they are an organic group which does not have photocrosslinkability, an aliphatic organic group with from 1 to 30 carbons is preferred, and as well as hydrocarbon groups they may also include in the structure, eg. hydroxyl groups, carbonyl groups, carboxyl groups, urethane groups, urea groups and amide groups. Preferred specific examples are the methyl group, ethyl group, isopropyl group, butyl group and t-butyl group. Furthermore, in the case where they are an organic group with photocrosslinkability, they preferably include an organic group containing, eg. an ethylenically unsaturated bond, an aromatic azide group or an aromatic sulphonylazide group. Specific examples are the methacryloyloxyethyl group, acryloyloxyethyl group, methacryloyloxypropyl group, acryloyloxypropyl group, methacrylamido-N-ethyl group, methacrylamido-N-propyl group, acrylamido-N-ethyl group, acrylamido-N-propyl group, ethyl azidobenzoate group, propyl azidobenzoate group, ethyl azidosulphonylbenzoate group and propyl azidosulphonylbenzoate group.

Each of $R^3$, $R^4$ and $R^5$ may be of a single type, or each may vary as bewteen respective units so as to provide a mixture of two or more types of organic group. Furthermore, each of $R^3$, $R^4$ and $R^5$ in a given structural unit may be the same as, or different from, one another.

Specific examples of compounds providing such residues are dimethylaminoethyl acrylate, diethylaminoethyl acrylate, dimethylaminoethyl methacrylate, diethylaminoethyl methacrylate, dimethylaminopropyl methacrylate, dimethylaminobutyl methacrylate, dimethylaminohexyl methacrylate, N-(2-dimethylaminoethyl)methacrylamide, N-(3-dimethyl-aminopropyl)methacrylamide, N-(2-diethylaminoethyl)-methacrylamide, N-(3-diethylaminopropyl)acrylamide, N-(2-dimethylaminoethyl) acrylamide, N-(3-dimethylaminopropyl)-acrylamide, N-(2-diethylaminoethyl)acrylamide, N-(3-diethylaminopropyl) acrylamide, acryloylmorpholine, meth-acryloylmorpholine, acryloylpiperidine, methacryloylpiperidine, allylamine, diallylamine, triallylamine, methallylamine, vinylpyridine, ethyltrimethylammonium methacrylate, 2-hydroxypropyltrimethylammonium methacrylate, p-(or m-)azidobenzoic acid dimethylaminoethyl ester, p-(or m-)azidobenzoic acid diethylaminoethyl ester, p-(or m-)azidobenzoic acid dimethylaminopropyl ester, p-(or m-)azidobenzoic acid diethylaminopropyl ester, p-(or m-)azidosulphonylbenzoic acid dimethylaminoethyl ester, p-(or m-)azidosulphonylbenzoic acid diethylaminoethyl ester, p-(or m-) azidosulphonylbenzoic acid dimethylaminopropyl ester and p-(or m-)azidosulphonylbenzoic acid diethyl-aminopropyl ester.

Of the specific examples given above, in order to enhance the photosensitive performance, those having an ethylenically unsaturated bond can be cited as especially preferred examples of the amine compound represented by general formula (4).

The polymer from which the polyimide precursor is obtainable in accordance with the present invention comprises one or more than one type of structural unit represented by general formula (1), ie. different values of $R^1$ and/or $R^2$. Furthermore, it may also be a copolymer or blend with other structural units, for example polyamides, polyesters, polyurethanes or polyureas. In such circumstances, it is especially preferred that at least 80 mol % of the structural units represented by general formula (1) are present. The types and amounts of structural units employed in copolymers or blends are preferably selected from within a range such that the heat resistance of the polyimide polymer obtained by the final heat treatment is not markedly impaired.

The degree of imidization Ia required for the viscosity of a varnish to have good stability with lapse of time will differ with the polymer structure. Normally, $0.03 \leq Ia \leq 0.6$ is preferred, with $0.06 \leq Ia \leq 0.5$ more preferred, and $0.08 \leq Ia \leq 0.4$ still more preferred, while $0.1 \leq Ia \leq 0.35$ is most preferred. In cases comprising two or more types of structural unit represented by general formula (1), the average degree of imidization Ia (measured as described later) needs to lie within the aforesaid range.

By way of explanation, if the polyimide precursor has a number of groups $n_1$ of the formula (1), $n_2$ of formula (2) and $n_3$ of formula (3) and if k in each stractural unit is 1, then the degree of imidization is given by equation (2)

$$\frac{n_2 + 2n_3}{2(n_1 + n_2 + n_3)} \quad (2)$$

The degree of imidization of the polyimide precursor can be controlled by the temperature at which the formation of the poly (amic acid) is carried out, which temperature controls the number of groups of formula (2) and/or (3) in the polymer.

The difference between the case of a non-photosensitive polyimide composition and a composition of the present invention is that the present invention relates to an actinic-radiation sensitive polymer composition, and the significance of the present invention lies in the fact that it provides a composition having both good viscosity stability with lapse of time and good photosensitive performance. Along with an increase in the degree of imidization, the number of carboxyl groups in the poly(amic acid) is reduced. Where the degree of imidization is over 0.6, the number of molecules of photopolymerizable amine compound represented by general formula (4) which interact with the carboxyl groups is markedly reduced. Hence, even though the viscosity stability of the composition is good, the problem arises that the sensitivity is considerably reduced. Furthermore, if the degree of imidization is less than 0.03, the room temperature viscosity stability is poor, so this is undesirable.

In particular, by employing residual groups derived from pyromellitic acid, which has high electron affinity, as at least 15 mol % of $R^1$ in general formula (1), it is possible to reduce the percentage imidization required for securing stability of viscosity with passage of time, as compared with a structure not containing pyromellitic acid residual groups. The photocrosslinking amine compound represented by formula (4) reacts with carboxyl groups for the poly (amic acid) to form ionic and/or hydrogen bonding therewith. When the degree of imidization of the poly(amic acid) is reduced, the number of carboxyl groups is increased. Hence, the number of molecules of photocrosslinking amine compound represented by general formula (4) which interact with carboxyl groups also increases. As a result, there is the advantage that the sensitivity is further enhanced, so this can be favourably employed.

The polyimide precursor in a composition of the present invention is typically obtained by the addition of an amine compound represented by general formula (4) to poly(amic acid) comprising units of general formulae (1), (2) and/or (3). In order to obtain a composition with both good stability of viscosity with lapse of time and good photosensitive performance, it is preferable to use a predetermined proportion of the amine compound represented by general formula (2) as described below and to provide at least a predetermined minimum number of photocrosslinking groups. Having regard to the amount added, it is desirable to mix with the poly (amic acid) from 0.4 to 5 molar equivalents and preferably 1 to 5 molar equivalents in terms of the carboxyl groups in the poly(amic acid) molecules. If there is less than 0.4 equivalents, a problem arises in that in a composition of high degree of imidization there is a marked lowering of sensitivity. If there is more than 5 molar equivalents, depending on the particular polymer structure, then at the time of exposure film shrinkage in the exposed regions may be increased and, at the time of developing, lifting of the pattern and cracking may occur, or alternatively the mechanical properties of the cured film may be considerably impaired, so care is needed.

Furthermore, in the case where the exposure wavelength at the time of pattern processing is the i-line (wavelength 365 nm), another problem may arise in that, along with an increase in the degree of imidization, the i-line transmittance of the film is reduced. However, by controlling the i-line transmittance in addition to the aforesaid degree of imidization and the number of photocrosslinking groups, it is possible to obtain a composition which is good both in terms of viscosity stability and photosensitive performance in i-line exposure.

Specifically, it is desirable that the transmittance of a prebake film of a varnish of the compsoition of thickness 10 microns at a wavelength of 365 nm be adjusted to lie in the range from 2% to 40%. Preferably, it is from 2% to 30%, more preferably from 4% to 30%, still more preferably from 4% to 20%, even more preferably from 4% to 15% and most preferably from 4% to 10%.

If the transmittance at a wavelength of 365 nm of a prebake film of thickness 10 microns is less than 2%, then pattern edge hollowing-out is produced at the time of pattern processing with an i-line, in that the width of the pattern grooves expands in the direction of the groove depth, thus providing an undesirable distortion. Furthermore, if the transmittance exceeds 40%, the influence of reflection from the substrate is increased, and a scum tends to be produced at the pattern bottom, so this is undesirable. Here, a "film of thickness 10 microns" refers to a film of thickness 10 microns formed by applying a varnish to a glass substrate and then, using a hot plate, heat treating for 2 to 5 minutes at 70–85° C., and then for 2–5 minutes at 90–100° C.

Most preferably, at least 20 mol % of $R^2$ in general formula (1) comprises at least one type of diamine residual group selected from the undermentioned general formulae (6) and (7).

By including these structures it is possible to further raise the i-line transmittance of the composition. Hence, there is the advantage that the degree of imidization range for good viscosity stability and which is suitable for i-line processing is greater than in the case of a composition which does not include such structures:

(6)

($Y^1$, $Y^2$ and $Y^3$ represent —O—, —S—, —CH$_2$—, —C(CH$_3$)$_2$—, —C(CF$_3$)$_2$—, —SO$_2$— or a single bond).

(7)

($R^6$ and $R^7$ represent CH$_3$—, CF$_3$—, C$_2$H$_5$—, C$_2$F$_5$—, (CH$_3$)$_3$C—, F, CH$_3$O— or the phenyl group).

The residual groups of the following compounds can be given as specific examples:

bis(aminophenoxyphenyl)propane, bis(aminophenoxyphenyl)-hexafluoropropane, bis(aminophenoxyphenyl)ether, bis-(aminophenoxyphenyl)methane, bis(aminophenoxyphenyl)-sulphone, bis(aminophenoxyphenyl)biphenyl, 2,2'-dimethylbenzidine, 2,2'-bis(trifluoromethyl)benzidine, 2,2'-diethylbenzidine, 2,2-bis(t-butyl)benzidine, 2,2'-bis(pentafluoroethyl)benzidine, 2,2-difluorobenzidine and 2,2-dimethoxybenzidine.

The value of the degree of imidization Ia of the polymer is calculated by means of infrared (IR) transmission spectrum measurement, by determining the absorbance at a wave number arising from the imide groups in the actinic radiation sensitive polymer composition which constitutes the sample (hereinafter referred to as the sample varnish). Normally, 1750–1800 cm$^{-1}$ is employed as the oscillatory wave number, arising from the imide groups, employed in the absorbance measurement. The wave number 1350–1400 cm$^{-1}$ is employed in those cases where there is present an organic group which has an absorption at 1750–1800 cm$^{-1}$. The details of the calculation method are explained below.

Firstly, the sample varnish is applied onto a silicon wafer by the spin coating method. Next, by drying under reduced pressure for 10 hours at 30° C., a film is formed and, by IR measurement, the absorbance I of the imide groups is determined. Next, this film is heat treated (cured) in an oven for 2 hours at 350° C. under a current of nitrogen and the imidization allowed to proceed to 100%. The rotation rate in the spin coating at the time of the film formation will have been adjusted such that the film thickness at this time, ie following the 2 hours curing at 350° C., is a specified thickness. IR measurement of this sample which has undergone 100% imidization is then carried out, and the absorbance $I_1$ at the wave number arising from the imide groups is determined.

At this time, equation (1) which shows the relationship between the imide group absorbance I and the degree of imidization Ia is as follows:

$$Ia = I/I_1 \qquad (1)$$

Figure 1:
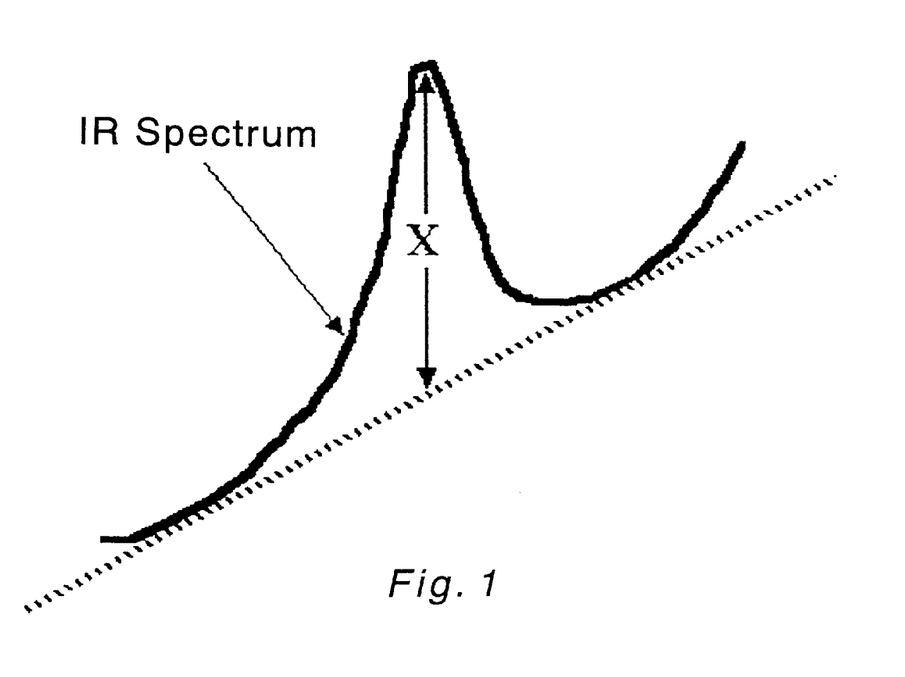
FIG. 1 shows an outline drawing illustrating the method for determining the absorbance arising from the imide groups in an IR spectrum.

With regard to this measurement of absorbance from the peak arising from the imide groups, as shown in FIG. 1 an auxiliary line is drawn joining both edges of the peak, and the point of intersection of this with the line dropped from the peak summit perpendicular to the horizontal axis of the IR spectrum is determined. The distance X between this point of intersection and the peak summit is taken as the absorbance.

With regard to the film thickness of the IR measurement sample, it is preferred that the film thickness following 2 hours curing at 350° C. under a current of nitrogen lies in the range from 0.5 microns to 6 microns, that is to say it is preferred that the film thickness following 10 hours drying under reduced pressure at 30° C. lies in the range from 0.7 microns to 18 microns. Outside of this range, there is inadequate solvent removal by the reduced pressure drying at the time of the sample preparation, or the intensity of the IR peak arising from the imide is weakened, so care is required in that measurement errors are increased.

The extent of the reduction in film thickness produced by the curing of the sample following drying under reduced pressure will differ according to the sample varnish composition. Thus, taking this into consideration, the rate of rotation of the spin coater is appropriately selected in accordance with the specified film thickness following curing.

Assessment as to whether or not the viscosity of the varnish shows good stability with lapse of time is carried out by determining the percentage fall in the viscosity of the varnish after leaving for 6 days at room temperature (23° C.) when compared with the viscosity right after preparation. If a varnish which shows a viscosity lowering of at least 10% at this time is daily applied at the same rotation rate onto silicon wafers, the film thickness of the polyimide film becomes thinner day by day. In such circumstances, it is hard to claim that the film production process is stable. Thus, a varnish which shows a viscosity lowering of at least 10% after leaving for 6 days at room temperature (23° C.) is assessed as not having good stability with lapse of time. In the case of the use of a varnish where the viscosity lowering after leaving for 6 days at room temperature is less than 10%, the reduction in the coated film thickness is extremely small, and lies within the permissible range for a stable film production process. Hence, a varnish having a viscosity reduction of less than 10% after being left for 6 days at room temperature (23° C.) is assessed as having good stability with lapse of time. In particular, it is most preferable to employ a varnish where the viscosity lowering after 6 days at room temperature is less than 5%.

Adjustment of the varnish degree of imidization can be carried out by means of the polymerization temperature and polymerization time when performing the polymer polymerization, and by means of the temperature and time when carrying out heat treatment or ageing of the varnish following polymerization or following photosensitization, but there is no restriction to these particular means.

Again, the method of mixing two or more types of varnish with different degrees of imidization is also effective.

These poly(amic acid) derivatives may be synthesized by known methods. Specifically, in the case of a poly(amic acid), synthesis may be carried out by selectively combining tetracarboxylic dianhydride and diamine, and reacting these in a polar solvent chiefly comprising N-methyl-2-pyrrolidone, N,N-dimethylacetamide, N,N-dimethylformamide, dimethylsulphoxide, hexamethylphosphoric triamide or γ-butyrolactone.

Photoinitiators suitable for use in a composition of the present invention are aromatic amines such as N-phenyldiethanolamine, N-phenylglycine and Michler's ketone, cyclic oxime compounds typified by 3-phenyl-5-isoxazolone and acyclic oxime compounds typified by 1-phenylpropanedione-2-(O-ethoxycarbonyl)oxime.

Sensitizers suitable for use in a composition of the present invention are those generally used in photocurable resins such as aromatic mono-azides, eg. azidoanthraquinone and azidobenzalacetophenone, coumarin compounds, eg. 3,3'-carbonylbis(diethylaminocoumarin), and aromatic ketones, eg. benzanthrone and phenanthrene-quinone. Additionally, those compounds employed as charge transfer agents in electrophotography can be used.

There is preferably added from 0.01 to 30 wt % and more preferably from 0.1 to 20 wt % of the photoinitiator or photosensitizer in terms of the polymer. Outside of this range, the photosensitivity may be lowered or the mechanical properties of the polymer impaired, so care needs to be taken. These photoinitiators and photosensitizers can be used singly or as mixtures of two or more types.

In order to increase the photosensitive performance of the composition of the present invention, photoreactive monomer can also be suitably used.

Examples of the photoreactive monomer are 2-hydroxyethyl methacrylate, 2-hydroxyethyl acrylate, trimethylolpropane trimethacrylate, trimethylolpropane triacrylate, ethylene glycol dimethacrylate, diethylene glycol dimethacrylate, triethylene glycol dimethacrylate, tetraethylene glycol dimethacrylate, propylene glycol dimethacrylate, methylene-bis(acrylamide), methylene-bis (methacrylamide), N,N-dimethylacrylamide, N,N-diethylacrylamide, N,N-dimethylmethacrylamide, N,N-diethylmethacrylamide, diacetoneacrylamide, glycidyl methacrylate and N-methylolmethacrylamide.

The photoreactive monomer is preferably added within the range up to 30 wt % in terms of the polymer. Outside of this range, the photosensitivity may be lowered and the mechanical properties of the polymer impaired, so care is required. These photoreactive monomers may be used singly or as mixtures of two or more types.

It is also possible to employ a suitable adhesion assistant in order to enhance the adhesion between the polyimide coating and substrate after the application or the heat treatment of the composition of the present invention.

Adhesion assistants which are preferably used are organic silicon compounds such as oxypropyltrimethoxysilane, γ-glycidoxypropyltrimethoxysilane, γ-aminopropyltriethoxy-silane and γ-methacryloxypropyltrimethoxysilane, aluminium chelate compounds such as aluminium monoethylaceto-acetate diisopropylate and aluminium tris(acetyl-acetonate), or titanium chelate compounds such as titanium bis (acetylacetonate).

Other additives which may be included are co-monomers or substrate adhesion improvers within a range such that the sensitivity and heat resistance are not markedly lowered.

Next, explanation is provided of a method of using the composition of the present invention. The composition of the present invention enables pattern processing to be carried out by known micro-processing techniques employing actinic radiation.

Firstly, the composition of the present invention is applied onto a suitable support. The material of the support can be, for example, metal, glass, semi-conductor, metal oxide insulating film or silicon nitride.

It is possible to employ, as the application method, means such as rotary application using a spin coater, spray application using a spray coater, immersion, printing or roll coating. The applied film thickness can be adjusted by the choice of means of application means, the solids concentration of the composition and its viscosity and, normally, application is carried out in the range 0.1 to 150 μm.

Next, the substrate on which the polyimide precursor has been applied is dried, and a polyimide precursor composition coating obtained. The drying is preferably carried out in the range 50 to 180° C. and more preferably in the range 75 to 150° C. using, eg an oven, hot plate or infrared radiation. The drying time is preferably from 1 minute to several hours.

Then, light exposure is carried out using a mask having a desired pattern. The level of exposure is preferably in the range 50 to 1000 mJ/cm$^2$. The particularly referred range is 100 to 700 mJ/cm$^2$.

For the purposes of enhancing the pattern resolution at the time of development and increasing the permitted range of developing conditions, a baking treatment process may be introduced prior to development. The temperature thereof is preferably in the range 50 to 180° C., with the range 60 to 150° C. particularly preferred. The time is preferably from 10 seconds to several hours. Outside of these ranges, there is a fear that reaction will not proceed or that the entire region no longer dissolves, so care is necessary.

Next, by dissolving away the un-irradiated regions with a developer liquid, a relief pattern is obtained. The developer liquid can be suitably selected in accordance with the polymer structure. For example, aqueous alkali solutions of ammonia, tetramethylammonium hydroxide or diethanolamine, can be advantageously used. Again, there can be used with advantage solvents for the composition such as N-methyl-2-pyrrolidone, N-acetyl-2-pyrrolidone, N,N-dimethylformamide, N,N-dimethylacetamide, dimethylsulphoxide or hexamethylphosphoric triamide, on their own, or as mixed solvents along with poor solvents for the composition such as methanol, ethanol, isopropyl alcohol, water, methylcarbitol, ethylcarbitol, toluene, xylene, ethyl lactate, ethyl pyruvate, propylene glycol monomethyl ether acetate, methyl-3-methoxypropionate, ethyl-3-ethoxypropionate, 2-heptanone or ethyl acetate.

The development can be carried out by applying the developing liquid to the coated film face directly, or by methods such as emission in the form of a spray, immersing in the developer liquid, or immersing while applying ultrasonics.

Next, it is preferred that the relief pattern formed by developing be washed with a rinse liquid. With regard to the rinse liquid, in the case where rinsing is carried out with an organic solvent there is preferably used one with good miscibility with the developer liquid such as methanol, ethanol, isopropyl alcohol, ethyl lactate, ethyl pyruvate, propylene glycol monomethyl ether acetate, methyl-3-methoxypropionate, ethyl-3-ethoxypropionate, 2-heptanone or ethyl acetate.

The relief pattern polymer obtained by the aforesaid treatment is a heat-resistant polyimide polymer precursor and by heat treatment there is formed heat resistant polymer having imide rings and other cyclic structures. The heat treatment is preferably carried out at a temperature of 135 to 500° C., more preferably at 300 to 450° C. under a current of nitrogen. The heat treatment is normally carried out while raising the temperature in a stepwise fashion or continuously.

EXAMPLES

Below, preferred embodiments of the present invention are explained in more specific terms based on Examples.

The viscosity measurement was carried out at a temperature of 25° C. using a rotary viscometer (E-type viscometer made by Tokimec Inc.).

The measurement of the infrared spectra was carried out using a dummy wafer as a blank, by means of a FT/IR-5000

(made by Nippon Bunko). The sample for spectrum measurement was prepared by application using a spinner (made by Mikasa) with the rate of rotation being selected so as to form a film of thickness 4 microns after curing at 350° C. for 2 hours under a current of nitrogen, after which reduced-pressure drying was performed using a vacuum oven DP-32 (made by Yamato). Curing was performed under a current of nitrogen.

Measurement of the UV-visible spectrum was carried out with a UV-260 (made by Shimadzu) using a glass substrate (identical to that employed in the sample preparation) as a blank. The sample for spectrum measurement was prepared by application using a spinner (made by Mikasa) with the rate of rotation being adjusted so as to form a film of thickness 10 microns after baking, following which baking was performed using a vacuum adsorption type hot plate SCW-636 (made by Dainippon Screen) for 2 minutes at 80° C. and then for 2 minutes at 100° C.

Assessment of the sensitivity was carried out as follows. Firstly, a prebake film of thickness 10 $\mu$m was prepared and exposure conducted. Next, baking was carried out prior to developing, and then developing and rinsing performed. Following development, the film thickness of the region exposed at 400 mJ/cm$^2$ was measured, and providing there was at least 7 $\mu$m of film remaining, the sensitivity was assessed as good.

Whether or not there was pattern edge hollowing-out, was assessed by observation of 100 $\mu$m×100 $\mu$m pattern with an optical microscope.

Example 1

38.0 g (0.19 mol) of 3,4'-diaminodiphenylether and 2.49 g (0.01 mol) of bis(3-aminopropyl)tetramethyldisiloxane were dissolved in 220 g of N-methyl-2-pyrrolidone at 20° C. in a 1 liter four-necked flask under a current of nitrogen. Subsequently, 32.2 g (0.10 mol) of 3,3',4,4'-benzophenonetetracarboxylic dianhydride and 21.8 g (0.10 mol) of pyromellitic anhydride were added, and reaction carried out for 1 hour at 55° C. and for a further 2 hours at 85° C. Subsequently, after cooling to 20° C., 4.73 g of N-phenylglycine, 74.0 g of diethylaminoethyl methacrylate and 91.3 g of N-methyl-2-pyrrolidone were added, then stirring performed for 2 hours at 25° C. under a current of dry air, and a photosensitive polyimide precursor composition of concentration 19.5% obtained. When the viscosity of this varnish was measured, it was 68 poise.

The composition obtained was spin coated onto a silicon wafer with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0301. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.301. From these absorbance values, when the degree of imidization of this sample was calculated using calibration equation (1) previously given, it was 0.1.

Furthermore, when a film of this varnish of thickness 10 microns was produced on a glass substrate by spin coating, and measurement of the ultraviolet-visible spectrum carried out, the light transmittance at 365 nm was 6.5%.

When the viscosity of this composition was measured after leaving for 6 days at room temperature (23° C.), it was 69 poise and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using an i-line stepper, DSW-8500-70i (made by GCA), the film surface was exposed to a pattern formed by passing an i-line of a hydrogen lamp through a mask, downsizing the resultant mask pattern and applying the downsized pattern to the film, at exposure levels of from 100 to 700 mJ/cm$^2$ in 100 mJ/cm$^2$ steps, and at 0 micron focus (ie the distance between the image formed by the i-line and the surface of the silicon wafer was about 0–1 $\mu$m). When this film was developed with a developer liquid comprising a ratio of 7:2:1 of NMP, xylene and water, a pattern of film thickness of at least 7 microns was obtained on the high exposure side, namely 400 mJ/cm$^2$ and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 2

38.0 g (0.19 mol) of 4,4'-diaminodiphenylether and 2.49 g (0.01 mol) of bis(3-aminopropyl)tetramethyldisiloxane were dissolved in 215 g of N-methyl-2-pyrrolidone at 20° C. in a 1 liter four-necked flask under a current of nitrogen. Subsequently, 30.9 g (0.096 mol) of 3,3',4,4'-benzophenonetetracarboxylic dianhydride and 20.9 g (0.096 mol) of pyromellitic anhydride were added, and reaction carried out for 1 hour at 55° C. and then for a further 2 hours at 70° C. Subsequently, after cooling to 20° C., 4.73 g of N-phenylglycine, 74.0 g of diethylaminoethyl methacrylate and 138 g of N-methyl-2-pyrrolidone were added, then stirring performed for 2 hours at 25° C. under a current of dry air, and a photosensitive polyimide precursor composition of concentration 17.6% obtained. When the viscosity of this varnish was measured, it was 58 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0206. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.304. From these absorbance values, when the degree of imidization of this sample was calculated using calibration equation (1), it was 0.06%.

Furthermore, when a film of this varnish of thickness 10 microns was produced on a glass substrate by spin coating, and measurement of the ultraviolet-visible spectrum carried out, the light transmittance at 365 nm was 1.3%.

When the viscosity of this composition was measured after leaving for 6 days at room temperature (23° C.), it was 59 poise, and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using a mask aligner, PLA-501FA (made by Cannon), the film surface was exposed via an i-line cutting filter and a mask at exposure levels of from 100 to 700 mJ/cm$^2$ in 100 mJ/cm$^2$ steps. When this film was developed with a developer liquid comprising a ratio of 7:2:1 of NMP, xylene and water, a pattern of film thickness of at least 7 microns was obtained on the high exposure side, namely 400 mJ/cm² and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 3

48.3 g (0.19 mol) of 3,3',5,5-tetramethyldiaminodiphenylmethane and 2.49 g (0.01 mol) of bis(3-aminopropyl) tetramethyldisiloxane were dissolved in 245 g of N-methyl-2-pyrrolidone at 20° C. in a 1 liter four-necked flask under a current of nitrogen. Subsequently, 32.2 g (0.10 mol) of 3,3',4,4'-benzophenonetetra-carboxylic dianhydride and 21.8 g (0.10 mol) of pyromellitic anhydride were added, and reaction carried out for 1 hour at 55° C. and then for 8 hours at 85° C. Subsequently, after cooling to 20° C., 5.24 g of N-phenylglycine, 58.0 g of dimethylaminohexyl methacrylate and 7.60 g of N-methyl-2-pyrrolidone were added, then stirring performed for 2 hours at 25° C. under a current of dry air, and a photosensitive polyimide precursor composition of concentration 24.9% obtained. When the viscosity of this varnish was measured, it was 42 poise.

The composition obtained was spin coated onto a silicon wafer with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0.133. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.277. From these absorbance values, when the degree of imidization of this sample was calculated using calibration equation (1), it was 0.48.

Furthermore, when a film of this varnish of thickness 10 microns was produced on a glass substrate by spin coating, and measurement of the ultraviolet-visible spectrum carried out, the light transmittance at 365 nm was 30%.

When the viscosity of this composition was measured after leaving for 6 days at room temperature (23° C.), it was 41 poise, and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using an i-line stepper, DSW-8500-70i (made by GCA), the film surface was exposed via a mask at exposure levels of from 100 to 700 mJ/cm² in 100 mJ/cm² steps, and at 0 micron focus.

When this film was developed with a developer liquid comprising a ratio of 9:3:2 of NMP, propylene glycol monomethyl ether acetate and water, a pattern of film thickness of at least 7 microns was obtained on the high exposure side, namely 400 mJ/cm² and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 4

47.6 g (0.11 mol) of bis[4-(3-aminophenoxy)phenyl]-sulphone, 16.0 g (0.08 mol) of 4,4'-diaminodiphenylether and 2.49 g (0.01 mol) of bis(3-aminopropyl) tetramethyldisiloxane were dissolved in 324 g of N-methyl-2-pyrrolidone at 20° C. in a 1 liter four-necked flask under a current of nitrogen. Subsequently, 32.2 g (0.10 mol) of 3,3',4,4'-benzophenonetetracarboxylic dianhydride and 21.8 g (0.10 mol) of pyromellitic anhydride were added, and reaction carried out for 1 hour at 55° C. and then for 4 hours at 85° C. Subsequently, after cooling to 20° C., 6.93 g of N-phenylglycine, 74.0 g of diethylaminoethyl methacrylate and 31.9 g of N-methyl-2-pyrrolidone were added, then stirring performed for 2 hours at 25° C. under a current of dry air, and a photosensitive polyimide precursor composition of concentration 21.5% obtained. When the viscosity of this varnish was measured, it was 43 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0281. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.281. From these absorbance values, when the degree of imidization of this sample was calculated using calibration equation (1), it was 0.1.

Furthermore, when a film of this varnish of thickness 10 microns was produced on a glass substrate by spin coating, and measurement of the ultraviolet-visible spectrum carried out, the light transmittance at 365 nm was 10%.

When the viscosity of this composition was measured after leaving for 6 days at room temperature (23° C.), it was 45 poise, and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using an i-line stepper, DSW-8500-70i (made by GCA), the film surface was exposed via a mask at exposure levels of from 100 to 700 mJ/cm² in 100 mJ/cm² steps, and at 0 micron focus. When this film was developed with a developer liquid comprising a ratio of 9:3:2 of NMP, propylene glycol monomethyl ether acetate and water, a pattern of film thickness of at least 7 microns was obtained on the high exposure side, namely 400 mJ/cm² and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 5

73.7 g (0.19 mol) of 4,4'-bis(4-aminophenoxy)biphenyl and 2.49 g (0.01 mol) of bis(3-aminopropyl)tetramethyldisiloxane were dissolved in 304 g of N-methyl-2-pyrrolidone at 20° C. in a 1 liter four-necked flask under a current of nitrogen. Subsequently, 32.2 g (0.10 mol) of 3,3',4,4'-benzophenonetetracarboxylic dianhydride and 21.8 g (0.10 mol) of pyromellitic anhydride were added, and reaction carried out for 1 hour at 55° C. and then for 4 hours at 75° C. Subsequently, after cooling to 20° C., 6.51 g of N-phenylglycine, 135.3 g of diethylaminoethyl methacrylate and 77.1 g of N-methyl-2-pyrrolidone were added, then stirring performed for 2 hours at 25° C. under a current of dry air, and a photosensitive polyimide precursor composition of concentration 20.0% obtained. When the viscosity of this varnish was measured, it was 56 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0251. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.251. From these absorbance values, when the degree of imidization of this sample was calculated using calibration equation (1), it was 0.1.

Furthermore, when a film of this varnish of thickness 10 microns was produced on a glass substrate by spin coating, and measurement of the ultraviolet·visible spectrum carried out, the light transmittance at 365 nm was 6%.

When the viscosity of this composition was measured after leaving for 6 days at room temperature (23° C.), it was 54 poise, and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using an i-line stepper, DSW-8500-70i (made by GCA), the film surface was exposed via a mask at exposure levels of from 100 to 700 mJ/cm$^2$ in 100 mJ/cm$^2$ steps, and at 0 micron focus.

When this film was developed with a developer liquid comprising a ratio of 9:3:2 of NMP, propylene glycol monomethyl ether acetate and water, a pattern of film thickness of at least 7 microns was obtained on the high exposure side, namely 400 mJ/cm$^2$ and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 6

82.2 g (0.19 mol) of bis[4-(4-aminophenoxy)phenyl]-sulphone and 2.49 g (0.01 mol) of bis(3-aminopropyl)-tetramethyldisiloxane were dissolved in 324 g of N-methyl-2-pyrrolidone at 20° C. in a 1 liter four-necked flask under a current of nitrogen. Subsequently, 32.2 g (0.10 mol) of 3,3',4,4'-benzophenonetetracarboxylic dianhydride and 21.8 g (0.10 mol) of pyromellitic anhydride were added, and reaction carried out for 1 hour at 55° C. and then for 4 hours at 75° C. Subsequently, after cooling to 20° C., 6.93 g of N-phenylglycine, 74.0 g of diethylaminoethyl methacrylate and 150 g of N-methyl-2 -pyrrolidone were added, then stirring performed for 2 hours at 25° C. under a current of dry air, and a photosensitive polyimide precursor composition of concentration 20.0% obtained. When the viscosity of this varnish was measured, it was 68 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0167. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.167. From these absorbance values, when the degree of imidization of this sample was calculated using calibration equation is (1), it was 0.1.

Furthermore, when a film of this varnish of thickness 10 microns was produced on a glass substrate by spin coating, and measurement of the ultraviolet·visible spectrum carried out, the light transmittance at 365 nm was 6%.

When the viscosity of this composition was measured after leaving for 6 days at room temperature (23° C.), it was 68 poise, and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using an i-line stepper, DSW-8500-70i (made by GCA), the film surface was exposed via a mask at exposure levels of from 100 to 700 mJ/cm$^2$ in 100 mJ/cm$^2$ steps, and at 0 micron focus. When this film was developed with a developer liquid comprising a ratio of 9:3:2 of NMP, propylene glycol monomethyl ether acetate and water, a pattern of film thickness of at least 7 microns was obtained on the high exposure side, namely 400 mJ/cm$^2$ and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 7

38.0 g (0.19 mol) of 3,4'-diaminodiphenylether and 2.49 g (0.01 mol) of bis(3-aminopropyl)tetramethyldisiloxane were dissolved in 232 g of N-methyl-2-pyrrolidone at 20° C. in a 1 liter four-necked flask under a current of nitrogen. Subsequently, 58.8 g (0.20 mol) of 3,3',4,4-biphenyltetracarboxylic dianhydride was added, and reaction carried out for 1 hour at 55° C. and then for 3 hours at 85° C. Subsequently, after cooling to 20° C., 4.97 g of N-phenylglycine, 74.0 g of diethylaminoethyl methacrylate and 51.6 g of N-methyl-2-pyrrolidone were added, then stirring performed for 2 hours at 25° C. under a current of dry air, and a photosensitive polyimide precursor composition of concentration 21.5% obtained. When the viscosity of this varnish was measured, it was 85 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0797. Next, this sample was cured for 2 hours at 350° C. under a current of nitrogen and 100% imidization effected. When the absorbance at the wave number (1750–1800 cm$^{-1}$ ) arising from the imide groups in this cured film of thickness 4 microns was determined, it was 0.469. From these absorbance values, when the degree of imidization of this sample was calculated using calibration equation (1), it was 0.17.

Furthermore, when a film of this varnish of thickness 10 microns was produced on a glass substrate by spin coating, and measurement of the ultraviolet·visible spectrum carried out, the light transmittance at 365 nm was 10%.

When the viscosity of this composition was measured after leaving for 6 days at room temperature (23° C.), it was 83 poise, and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using an i-line stepper, DSW-8500-70i (made by GCA), the film surface was exposed via a mask at exposure levels of from 100 to 700 mJ/cm$^2$ in 100 mJ/cm$^2$ steps, and at 0 micron focus. When this film was developed with a developer liquid comprising a ratio of 9:3:2 of NMP, propylene glycol monomethyl ether acetate and water, a pattern of film thickness of at least 7 microns was obtained on the high exposure side, namely 400 mJ/cm$^2$ and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 8

313.6 g (1.07 mol) of 3,3',4,4'-biphenyltetracarboxylic dianhydride and 600 g of N-methyl-2-pyrrolidone plus 240 g of γ-butyrolactone were added to a 1 liter four-necked flask and stirred at room temperature while introducing dry air. Next, 78.2 g (0.39 mol) of 4,4'-diaminodiphenylether, 11.2 g (0.045 mol) of bis(3-aminopropyl) tetramethyldisiloxane, 38.0 g of N-methyl-2-pyrrolidone and 20.0 g of γ-butyrolactone were added and stirring carried out for 1 hour at 60° C. under dry air. Then, 138.6 g of 2-hydroxyethyl methacrylate and 20.0 of γ-butyrolactone were added, then stirring carried out for 3 hours at 60° C. under dry air, and the mixture cooled to room temperature. Next, 19.6 g (0.098 mol) of 4,4'-diaminodiphenyl ether, 57.6 g (0.53 mol) of p-phenylenediamine and 12.0 g of γ-butyrolactone were added and stirring carried out for 5 hours at 60° C. under dry air. Subsequently, after cooling to room temperature, 4.80 g of 4-azidobenzalacetophenone, 28.8 g of N-phenylglycine, 24.0 g of ethylene glycol dimethacrylate, 185.0 g of N-methyl-2-pyrrolidone and 113.4 g of γ-butyrolactone were added, then stirring performed for 2 hours at 25° C. under dry air, and a photosensitive polyimide precursor composition of concentration 23.5% obtained. When the viscosity of this varnish was measured after aging for 6 days at 23° C., it was 98.8 poise.

The composition obtained was spin coated onto a silicon wafer with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1350–1400 cm$^{-1}$ as a peak arising from the imide groups, when the absorbance at this wave number was measured it was 0.264. Next, this sample was cured for 2 hours at 350° C. under a current of nitrogen and 100% imidization effected. When the absorbance at the wave number (1350–1400 cm$^{-1}$) arising from the imide groups in this cured film of thickness 4 microns was determined, it was 1.2. From these absorbance values, when the degree of imidization of this sample was calculated using calibration equation (1), it was 0.22.

Furthermore, when a film of this varnish of thickness 10 microns was produced on a glass substrate by spin coating, and measurement of the ultraviolet·visible spectrum carried out, the light transmittance at 365 nm was 0%.

When the viscosity of this composition was measured after leaving for 6 days at room temperature (23° C.), it was 100 poise and so, with the viscosity reduction being less than 10%, the stability with lapse of time was good.

This solution was applied onto a 4" silicon wafer by spin coating and, using a hot plate SCW-636 (made by Dainippon Screen), baking was carried out for 4 minutes at 80° C. and then for 4 minutes at 100° C., and a film of 10 micron film thickness obtained. Next, using a g-line stepper (436 nm), NSR-1505G6E (made by Nikon), the film surface was exposed via a mask at exposure levels of from 100 to 700 mJ/cm$^2$ in 100 mJ/cm$^2$ steps, and at 0 microns focus. When this film was developed with a developer comprising a ratio of 7:2:1 of NMP:xylene:water, a pattern of film thickness 7 microns was obtained on the high exposure side, namely 400 mJ/cm$^2$ and above. There was no pattern edge hollowing-out and it was an good pattern. When this was heat treated for 30 minutes under a current of nitrogen at temperatures of 200° C., 300° C. and 400° C. respectively, a polyimide pattern was obtained.

Example 9

26.0 g (0.13 mol) of 3,4'-diaminodiphenylether, 19.2 g (0.06 mol) of 2,2'-bis(trifluoromethyl)benzidine and 2.49 g (0.01 mol) of bis(3-aminopropyl)tetramethyldisiloxane were dissolved in 232 g of N-methyl-2-pyrrolidone at 20° C. in a 1 liter four-necked flask under a current of nitrogen. Subsequently, 19.3 g (0.06 mol) of 3,3',4,4'-benzophenonetetracarboxylic dianhydride, 13.1 g (0.06 mol) of pyromellitic anhydride and 24.8 g (0.08 mol) of 3,3',4,4-diphenylethertetracarboxylic dianhydride were added, and reaction carried out for 1 hour at 55° C. and for a further 3 hours at 75 C. Subsequently, after cooling to 20° C., 4.97 g of N-phenylglycine, 74.0 g of diethylaminoethyl methacrylate and 92.7 g of N-methyl-2-pyrrolidone were added, then stirring performed for 2 hours at 25° C. under a current of dry air, and a photosensitive polyimide precursor composition of concentration 20.0% obtained. When the viscosity of this varnish was measured, it was 85 poise.

The composition obtained was spin coated onto a silicon wafer with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0499. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.384. From these absorbance values, when the degree of imidization of this sample was calculated using calibration equation (1), it was 0.13.

Furthermore, when a film of this varnish of thickness 10 microns was produced on a glass substrate by spin coating, and measurement of the ultraviolet·visible spectrum carried out, the light transmittance at 365 nm was 18%.

When the viscosity of this composition was measured after leaving for 6 days at room temperature (23° C.), it was 83 poise, and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using an i-line stepper, DSW-8500-70i (made by GCA), the film surface was exposed via a mask at exposure levels of from 100 to 700 mJ/cm$^2$ in 100 mJ/cm$^2$ steps, and at 0 micron focus. When this film was developed with a developer liquid comprising a ratio of 9:3:2 of NMP, propylene glycol monomethyl ether acetate and water, a pattern of film thickness of at least 7 microns was obtained on the high exposure side, namely 400 mJ/cm$^2$ and above. The pattern was good and there was no pattern edge hollowing-out.

When this was heat treated for 30 minutes under a current of nitrogen at temperatures of 200° C., 300° C. and 400° C. respectively, a polyimide pattern was obtained.

Example 10

82.2 g (0.19 mol) of bis[4-(3-aminophenoxy)phenyl]-sulphone and 2.49 g (0.01 mol) of bis(3-aminopropyl) tetramethyldisiloxane were dissolved in 324 g of N-methyl-2-pyrrolidone at 20° C. in a 1 liter four-necked flask under a current of nitrogen. Subsequently, 24.8 g (0.08 mol) of 3,3',4,4'-diphenylethertetra-carboxylic dianhydride and 35.3 g (0.12 mol) of 3,3',4,4'-biphenyltetracarboxylic dianhydride were added, and reaction carried out for 1 hour at 55° C. and for a further 4 hours at 85° C. Subsequently, after cooling to 20° C., 6.93 g of N-phenylglycine, 74.0 g of diethylaminoethyl methacrylate and 123.7 g of N-methyl-2-pyrrolidone were added, then stirring performed for 2 hours at 25° C. under a current of dry air, and a photosensitive polyimide precursor composition of concentration 21.5% obtained. When the viscosity of this varnish was measured, it was 23 poise.

The composition obtained was spin coated onto a silicon wafer with the rotation rate adjusted such that the film thickness after 2 hours curing at 350° C. under a current of nitrogen was 4 microns and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.025. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.313. From these absorbance values, when the degree of imidization of this sample was calculated using calibration equation (1), it was 0.08.

Furthermore, when a film of this varnish of thickness 10 microns was produced on a glass substrate by spin coating, and measurement of the ultraviolet visible spectrum carried out, the light transmittance at 365 nm was 30%.

When the viscosity of this composition was measured after leaving for 6 days at room temperature (23° C.), it was 24 poise, and so, with the viscosity reduction being less than 10%, the stability with lapse of time was good.

This solution was spin coated onto a 4" silicon wafer, and by baking for 2 minutes at 80° C. and then for 2 minutes at 95° C. using a hot plate SCW-636 (made by Dainippon Screen), a film of thickness 10 microns was obtained. Next, using an i-line stepper, DSW-8500-70i (made by GCA), the film surface was exposed via a mask at exposure levels of from 100 to 700 mJ/cm$^2$ in 100 mJ/cm$^2$ steps, and at 0 micron focus. When this film was developed with a developer liquid comprising a ratio of 9:3:2 of NMP, propylene glycol monomethyl ether acetate and water, a pattern of film thickness of at least 7 microns was obtained on the high exposure side, namely 400 mJ/cm$^2$ and above. The pattern was good and there was no pattern edge hollowing-out. When this was heat treated for 30 minutes under a current of nitrogen at temperatures of 200° C., 300° C. and 400° C. respectively, a polyimide pattern was obtained.

Comparative Example 1

38.0 g (0.19 mol) of 3,4'-diaminodiphenyl ether and 2.49 g (0.01 mol) of bis(3-aminopropyl)tetramethyldi-siloxane were dissolved at 20° C. in 217 g of N-methyl-2-pyrrolidone in a 1 liter four-necked flask under a current of nitrogen. Subsequently, 31.3 g (0.097 mol) of 3,3',4,4'-benzophenonetetracarboxylic dianhydride and 21.2 g (0.097 mol) of pyromellitic anhydride were added and reaction carried out for 10 hours at 10° C. Subsequently, 4.73 g of N-phenylglycine, 74.0 g of diethylaminoethyl methacrylate and 76.2 g of N-methyl-2-pyrrolidone were added, then stirring carried out for 5 hours at 10° C. under a current of dry air and a photosensitive polyimide precursor composition of concentration 20.0% obtained. When the viscosity of this varnish was measured, it was 68 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.006. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.301. From these absorbance values, when the degree of imidization of this sample was calculated using calibration equation (1), it was 0.02.

Furthermore, when a film of this varnish of thickness 10 microns was produced on a glass substrate by spin coating, and measurement of the ultraviolet visible spectrum carried out, the light transmittance at 365 nm was 8.5%.

When the viscosity of this composition was measured after leaving for 6 days at room temperature (23° C.), it was 54 poise, and so, with the viscosity reduction being at least 15%, the stability with lapse of time was poor.

Comparative Example 2

38.0 g (0.19 mol) of 4,4'-diaminodiphenyl ether and 2.49 g (0.01 mol) of bis(3-aminopropyl)tetramethyl-disiloxane were dissolved at 20° C. in 235 g of N-methyl-2-pyrrolidone in a 1 liter four-necked flask under a current of nitrogen. Subsequently, 30.3 g (0.094 mol) of 3,3',4,4'-benzophenonetetracarboxylic dianhydride and 20.5 g (0.094 mol) of pyromellitic anhydride were added and reaction carried out for 10 hours at 10° C. Subsequently, 4.73 g of N-phenylglycine, 74.0 g of diethylaminoethyl methacrylate and 51.4 g of N-methyl-2-pyrrolidone were added, then stirring carried out for 5 hours at 10° C. under a current of dry air and a photosensitive polyimide precursor composition of concentration 20.0% obtained. When the viscosity of this varnish was measured, it was 92 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.007. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.343. From these absorbance values, when the degree of imidization of this sample was calculated using calibration equation (1), it was 0.02.

Furthermore, when a film of this varnish of thickness 10 microns was produced on a glass substrate by spin coating, and measurement of the ultraviolet visible spectrum carried out, the light transmittance at 365 nm was 2%.

When the viscosity of this composition was measured after leaving for 6 days at room temperature (23° C.), it was 78 poise, and so, with the viscosity reduction being at least 10%, the stability with lapse of time was poor.

Comparative Example 3

48.3 g (0.19 mol) of 3,3',5,5-tetramethyldiaminodiphenylmethane and 2.49 g (0.01 mol) of bis(3-aminopropyl)-tetramethyldisiloxane were dissolved at 20° C. in 241 g of N-methyl-2-pyrrolidone in a 1 liter four-necked flask under a current of nitrogen. Subsequently, 31.3 g (0.097 mol) of 3,3',4,4-benzophenonetetracarboxylic dianhydride and 21.2 g (0.097 mol) of pyromellitic anhydride were added and reaction carried out for 10 hours at 10° C. Subsequently, 5.24 g of N-phenylglycine, 74.0 g of diethylaminoethyl methacrylate and 92.9 g of N-methyl-2-pyrrolidone were added, then stirring carried out for 5 hours at 10° C. under a current of dry air and a photosensitive polyimide precursor composition of concentration 20.0% obtained. When the viscosity of this varnish was measured, it was 136 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.006. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.277 From these absorbance values, when the degree of imidization of this sample was calculated using calibration equation (1), it was 0.02.

Furthermore, when a film of this varnish of thickness 10 microns was produced on a glass substrate by spin coating, and measurement of the ultraviolet·visible spectrum carried out, the light transmittance at 365 nm was 60%.

When the viscosity of this composition was measured after leaving for 6 days at room temperature (23° C.), it was 102 poise, and so, with the viscosity reduction being at least 20%, the stability with lapse of time was poor.

Comparative Example 4

82.2 g (0.19 mol) of bis[4-(3-aminophenoxy)phenyl]-sulphone and 2.49 g (0.01 mol) of bis(3-aminopropyl)-tetramethyldisiloxane were dissolved at 20° C. in 320 g of N-methyl-2-pyrrolidone in a 1 liter four-necked flask under a current of nitrogen. Subsequently, 31.3 g (0.097 mol) of 3,3',4,4-benzophenonetetracarboxylic di-anhydride and 21.2 g (0.097 mol) of pyromellitic anhydride were added and reaction carried out for 10 hours at 10° C. Subsequently, 6.93 g of N-phenylglycine, 74.0 g of diethylaminoethyl methacrylate and 148 g of N-methyl-2-pyrrolidone were added, then stirring carried out for 5 hours at 10° C. under a current of dry air and a photosensitive polyimide precursor composition of concentration 20.0% obtained. When the viscosity of this varnish was measured, it was 39 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.005. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.261. From these absorbance values, when the degree of imidization of this sample was calculated using calibration equation (1), it was 0.02.

Furthermore, when a film of this varnish of thickness 10 microns was produced on a glass substrate by spin coating, and measurement of the ultraviolet·visible spectrum carried out, the light transmittance at 365 nm was 40%.

When the viscosity of this composition was measured after leaving for 6 days at room temperature (23° C.), it was 24 poise, and so, with the viscosity reduction being at least 30%, the stability with lapse of time was poor.

Comparative Example 5

38.0 g (0.19 mol) of 4,4'-diaminodiphenyl ether and 2.49 (0.01 mol) of bis(3-aminopropyl)tetramethyldisiloxane were dissolved at 20° C. in 215 g of N-methyl-2-pyrrolidone in a 1 liter four-necked flask under a current of nitrogen. Subsequently, 30.9 g (0.096 mol) of 3,3',4,4'-benzophenonetetracarboxylic dianhydride and 20.9 g (0.096 mol) of pyromellitic anhydride were added and reaction carried out for 1 hour at 55° C. and a further 2.5 hours at 70° C. Subsequently, this was cooled to room temperature, 4.73 g of N-phenylglycine and 187 g of N-methyl-2-pyrrolidone were added, then stirring carried out for 2 hours at 25° C. under a current of dry air and a photosensitive polyimide precursor composition of concentration 18.5% obtained. When the viscosity of this varnish was measured, it was 58 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 cm$^{-1}$ as a peak arising from the imide groups, when the absorbance at this wave number was measured it was 0.0206. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.343. From these absorbance values, when the degree of imidization of this sample was calculated using calibration equation (1), it was 0.06.

Furthermore, when a film of this varnish of thickness 10 microns was produced on a glass substrate by spin coating, and measurement of the ultraviolet·visible spectrum carried out, the light transmittance at 365 nm was 1.3%.

When the viscosity of this composition was measured after leaving for 6 days at room temperature (23° C.), it was 59 poise, and so, with the viscosity reduction being less than 10%, the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using a mask aligner PLA-501FA (made by Cannon), the film surface was exposed via an i-line cutting filter and a mask, placed substantially in contact with the film (ie with a gap of 0–100 μm), at exposure levels of from 100 to 700 mJ/cm$^2$ in 100 mJ/cm$^2$ steps. This film was developed with a developer comprising NMP, xylene and water of ratio 7:2:1, but all dissolved, and there was no pattern formation.

Comparative Example 6

38.0 g (0.19 mol) of 4,4'-diaminodiphenyl ether and 2.49 g (0.01 mol) of bis(3-aminopropyl)tetramethyl-disiloxane were dissolved at 20° C. in 215 g of N-methyl-2-pyrrolidone in a 1 liter four-necked flask under a current of nitrogen. Subsequently, 30.9 g (0.096 mol) of 3,3',4,4'-benzophenonetetracarboxylic dianhydride and 20.9 g (0.096 mol) of pyromellitic anhydride were added and reaction carried out for 1 hour at 55° C. and a further 2 hours at 70° C. Subsequently, this was cooled to 20° C., 4.73 g of N-phenylglycine, 74.0 g of tri-n-butylamine and 138 g of N-methyl-2-pyrrolidone were added, then stirring carried out for 2 hours at 25° C. under a current of dry air and a photosensitive polyimide precursor composition of concentration 17.6% obtained. When the viscosity of this varnish was measured, it was 58 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 $cm^{-1}$ as a peak arising from the imide groups, when the absorbance at this wave number was measured it was 0.0207. Next, this sample was cured for 2 hours at 350° C. under a current of nitrogen and 100% imidization effected. When the absorbance at the wave number (1750–1800 $cm^{-1}$) arising from the imide groups in this cured film of thickness 4 microns was determined, it was 0.343. From these absorbance values, when the degree of imidization of this sample was calculated using calibration equation (1), it was 0.06.

Furthermore, when a film of this varnish of thickness 10 microns was produced on a glass substrate by spin coating, and measurement of the ultraviolet·visible spectrum carried out, the light transmittance at 365 nm was 1.3%.

When the viscosity of this composition was measured after leaving for 6 days at room temperature (23° C.), it was 59 poise and so, with the viscosity reduction being less than 10%, the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using a mask aligner PLA-501FA (made by Cannon), the film surface was exposed via an i-line cutting filter and a mask at exposure levels of from 100 to 700 mJ/$cm^2$ in 100 mJ/$cm^2$ steps. This film was developed with a developer comprising NMP, xylene and water of ratio 7 : 2: 1, but all dissolved, and there was no pattern formation.

Comparative Example 7

48.3 g (0.19 mol) of 3,3',5,5'-tetramethyldiamino-diphenylmethane and 2.49 g (0.01 mol) of bis(3-aminopropyl)tetramethyldisiloxane were dissolved at 20° C. in 245 g of N-methyl-2-pyrrolidone in a 1 liter four-necked flask under a current of nitrogen. Subsequently, 32.2 g (0.10 mol) of 3,3',4,4'-benzophenonetetra-carboxylic dianhydride and 21.8 g (0.10 mol) of pyromellitic anhydride were added and reaction carried out for 1 hour at 55° C. and a further 8 hours at 100° C. Subsequently, after cooling to room temperature, 5.24 g of N-phenylglycine, 58.0 g of dimethylaminohexyl methacrylate and 7.60 g of N-methyl-2-pyrrolidone were added, then stirring carried out for 2 hours at 25° C. under a current of dry air and a photosensitive polyimide precursor composition of concentration 24.9% obtained. When the viscosity of this varnish was measured, it was 12 poise.

The composition obtained was applied onto a silicon wafer using a spin coater with the rotation rate adjusted such that the film thickness after 2 hours curing at 350° C. under a current of nitrogen was 4 microns, and then, after drying under reduced pressure for 10 hours at 30° C., the infrared spectrum was measured. Selecting the peak shown at 1750–1800 $cm^{-1}$ as a peak arising from the imide groups, when the absorbance at this wave number was measured it was 0.194. Next, this sample was cured for 2 hours at 350° C. under a current of nitrogen and 100% imidization effected. When the absorbance at the wave number (1750–1800 $cm^{-1}$) arising from the imide groups in this cured film of thickness 4 microns was determined, it was 0.277. From these absorbance values, when the degree of imidization of this sample was calculated using calibration equation (1), it was 0.7.

Furthermore, when a film of this varnish of thickness 10 microns was produced on a glass substrate by spin coating, and measurement of the ultraviolet·visible spectrum carried out, the light transmittance at 365 nm was 20%.

When the viscosity of this composition was measured after leaving for 6 days at room temperature (23° C.), it was 12.5 poise and so, with the viscosity reduction being less than 10%, the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using an i-line stepper, DSW-8500-70i (made by GCA), the film surface was exposed via a mask at exposure levels of from 100 to 700 mJ/$cm^2$ in 100 mJ/$cm^2$ steps, with the focus 0 microns. When this film was developed with a developer comprising NMP, propylene glycol monomethyl ether acetate and water of ratio 9:3:2, only a pattern of film thickness of 5 microns was obtained even at the high exposure region of 700 mJ/$cm^2$.

Example Numbers 10 to 16 were performed by mixing varnishes prepared in the following Synthesis Examples 1 to 7.

Synthesis Example 1

38.0 g (0.19 mol) of 3,4'-diaminodiphenyl ether and 2.49 g (0.01 mol) of bis(3-aminopropyl)tetramethyldi-siloxane were dissolved at 20° C. in 220 g of N-methyl-2-pyrrolidone in a 1 liter four-necked flask under a current of nitrogen. Subsequently, 32.2 g (0.10 mol) of 3,3',4,4'-benzophenonetetracarboxylic dianhydride and 21.8 g (0.10 mol) of pyromellitic anhydride were added, and reaction carried out for 1 hour at 55° C. and for a further 6 hours at 85° C. Next, after cooling to 20° C., 4.73 g of N-phenylglycine, 74.0 g of diethylaminoethyl methacrylate and 23.0 g of N-methyl-2-pyrrolidone were added, and stirring carried out for 2 hours at 25° C. under a current of dry air, to produce a photosensitive polyimide precursor composition of concentration 22.7%, which was taken as varnish A. When the viscosity of the varnish A obtained was measured, it was 64 poise.

Synthesis Example 2

38.0 g (0.19 mol) of 4,4'-diaminodiphenyl ether and 2.49 g (0.01 mol) of bis(3-aminopropyl)tetramethyldi-siloxane were dissolved at 20° C. in 220 g of N-methyl-2-pyrrolidone in a 1 liter four-necked flask under a current of nitrogen. Subsequently, 32.2 g (0.10 mol) of 3,3',4,4'-benzophenonetetracarboxylic dianhydride and 21.8 g (0.10 mol) of pyromellitic anhydride were added, and reaction carried out for 1 hour at 55° C. and for a further 6 hours at 85° C. Next, after cooling to 20° C., 4.73 g of N-phenylglycine, 74.0 g of diethylaminoethyl methacrylate and 147 g of N-methyl-2-pyrrolidone were added, and stirring carried out for 2 hours at 25° C. under a current of dry air, to produce a photosensitive polyimide precursor composition of concentration 17.5%, which was taken as varnish B. When the viscosity of the varnish B obtained was measured, it was 40 poise.

Synthesis Example 3

48.3 g (0.19 mol) of 3,3',5,5'-tetramethyldiaminodiphenyl-methane and 2.49 g (0.01 mol) of bis(3-aminopropyl)-tetramethyldisiloxane were dissolved at 20° C. in 245 g of N-methyl-2-pyrrolidone in a 1 liter four-necked flask under a current of nitrogen. Subsequently, 32.2 g (0.10 mol) of 3,3',4,4'-benzophenonetetracarboxylic di-anhydride and 21.8 g (0.10 mol) of pyromellitic anhydride were added, and reaction carried out for 1 hour at 55° C. and for a further 6 hours at 85° C. Next, after cooling to 20° C., 5.24 g of N-phenylglycine, 74.0 g of diethylaminoethyl methacrylate and 24.6 g of N-methyl-2-pyrrolidone were added, and stirring carried out for 2 hours at 25° C. under a current of dry air, to produce a photosensitive polyimide precursor composition of concentration 23.1%, which was taken as varnish C. When the viscosity of the varnish C obtained was measured, it was 49 poise.

Synthesis Example 4

38.0 g (0.19 mol) of 3,4'-diaminodiphenyl ether and 2.49 g (0.01 mol) of bis(3aminopropyl)tetramethyldi-siloxane were dissolved at 20° C. in 217 g of N-methyl-2-pyrrolidone in a 1 liter four-necked flask under a current of nitrogen. Subsequently, 31.3 g (0.097 mot) of 3,3',4,4'-benzophenonetetracarboxylic dianhydride and 21.2 g (0.097 mol) of pyromellitic anhydride were added, and reaction carried out for 10 hours at 10C. Next, 4.73 g of N-phenylglycine, 74.0 g of diethylaminoethyl methacrylate and 76.2 g of N-methyl-2-pyrrolidone were added, and stirring carried out for 5 hours at 10° C. under a current of dry air, to produce a photosensitive polyimide precursor composition of concentration 20.0%, which was taken as varnish D. When the viscosity of the varnish D obtained was measured, it was 68 poise.

Synthesis Example 5

38.0 g (0.19 mol) of 4,4'-diaminodiphenyl ether and 2.49 g (0.01 mol) of bis(3-aminopropyl)tetramethyldi-siloxane were dissolved at 20° C. in 235 g of N-methyl-2-pyrrolidone in a 1 liter four-necked flask under a current of nitrogen. Subsequently, 30.3 g (0.094 mol) of 3,3',4,4'-benzophenonetetracarboxylic dianhydride and 20.5 g (0.094 mol) of pyromellitic anhydride were added, and reaction carried out for 10 hours at 10° C. Next, 4.73 g of N-phenylglycine, 74.0 g of diethylaminoethyl methacrylate and 51.4 g, of N-methyl-2-pyrrolidone were added, and stirring carried out for 5 hours at 10° C. under a current of dry air, to produce a photosensitive polyimide precursor composition of concentration 20.0%, which was taken as varnish E. When the viscosity of the varnish E obtained was measured, it was 92 poise.

Synthesis Example 6

48.3 g (0.19 mol) of 3,3',5,5'-tetramethyldiaminodiphenyl-methane and 2.49 g (0.01 mol) of bis(3-aminopropyl)-tetramethyldisiloxane were dissolved at 20° C. in 241 g of N-methyl-2-pyrrolidone in a 1 liter four-necked flask under a current of nitrogen. Subsequently, 31.3 g (0.097 mol) of 3,3',4,4'-benzophenonetetracarboxylic dianhydride and 21.2 g (0.097 mol) of pyromellitic anhydride were added, and reaction carried out for 10 hours at 10° C. Next, 5.24 g of N-phenylglycine, 74.0 g of diethylaminoethyl methacrylate and 92.9 g of N-methyl-2-pyrrolidone were added, and stirring carried out for 5 hours at 10° C. under a current of dry air, to produce a photosensitive polyimide precursor composition of concentration 20.0%, which was taken as varnish F. When the viscosity of the varnish F obtained was measured, it was 136 poise.

Synthesis Example 7

82.2 g (0.19 mol) of bis[4-(3-aminophenoxy)phenyl]-sulphone and 2.49 g (0.01 mol) of bis(3-aminopropyl)-tetramethyldisiloxane were dissolved at 20° C. in 320 g of N-methyl-2-pyrrolidone in a 1 liter four-necked flask under a current of nitrogen. Subsequently, 31.3 g (0.097 mol) of 3,3',4,4'-benzophenonetetracarboxylic dianhydride and 21.2 g (0.097 mol) of pyromellitic anhydride were added, and reaction carried out for 10 hours at 10° C. Next, 6.93 g of N-phenylglycine, 74.0 g of diethylaminoethyl methacrylate and 148 g of N-methyl-2-pyrrolidone were added, and stirring carried out for 5 hours at 10° C. under a current of dry air, to produce a photosensitive polyimide precursor composition of concentration 20.0%, which was taken as varnish G. When the viscosity of the varnish G obtained was measured, it was 39 poise.

Example 11

When varnishes A and E were blended in the weight ratio 35:65 and the viscosity measured, it was 85 poise. The composition obtained was spin coated onto a silicon wafer with the rotation rate adjusted so that the film thickness after curing for 2 hours at 350° C. under a current of nitrogen was 4 microns, and then, after drying under reduced pressure for 10 hours at 30° C., measurement of the infrared spectrum was carried out. Selecting the peak shown at 1750–1800 $cm^{-1}$ as a peak arising from the imide groups, when the absorbance at this wave number was measured it was 0.0361. Next, this sample was cured for 2 hours at 350° C. under a current of nitrogen and 100% imidization effected. When the absorbance at the wave number (1750–1800 $cm^{-1}$) arising from the imide groups in this cured film of thickness 4 microns was determined, it was 0.328. From these absorbance values, when the degree of imidization of this sample was calculated using calibration equation (1), it was 0.11.

When the viscosity of this composition was measured after leaving for 6 days at room temperature (23° C.), it was 86 poise, and so, with the viscosity reduction being less than 10% the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using a mask aligner PLA-501FA (made by Cannon), the film surface was exposed via an i-line cutting filter and a mask at exposure levels of from 100 to 700 $mJ/cm^2$ in 100 $mJ/cm^2$ steps. When this film was developed with a developer comprising NMP, xylene and water of ratio 7:2:1, a pattern of film thickness of 7 microns was obtained on the high exposure side, namely 400 $mJ/cm^2$ and above. The pattern was good and there was no pattern edge hollowing-out. When this was heat treated for 30 minutes under a current of nitrogen at temperatures of 200° C., 300° C. and 400° C. respectively, a polyimide pattern of film thickness 4.5 microns was obtained.

Example 12

When varnishes A and F were blended in the weight ratio 90:10 and the viscosity measured, it was 72 poise. The composition obtained was spin coated onto a silicon wafer with the rotation rate adjusted so that the film thickness after curing for 2 hours at 350° C. under a current of nitrogen was 4 microns and then, after drying under reduced pressure for 10 hours at 30° C., measurement of the infrared spectrum was carried out. Selecting the peak shown at 1750–1800 cm$^{-1}$ as a peak arising from the imide groups, when the absorbance at this wave number was measured it was 0.0837. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.299. From these absorbance values, when the degree of imidization of the sample was calculated using calibration equation (1), it was 0.28.

When the viscosity of this composition was measured after leaving for 6 days at room temperature (23° C.), it was 70 poise, and so, with the viscosity reduction being less than 10%, the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using a mask aligner PLA-501FA (made by Cannon), the film surface was exposed via an i-line cutting filter and a mask at exposure levels of from 100 to 700 mJ/cm$^2$ in 100 mJ/cm$^2$ steps. When this film was developed with a developer comprising NMP, xylene and water of ratio 7:2:1, a pattern of film thickness of 7 microns was obtained on the high exposure side, namely 400 mJ/cm$^2$ and above. The pattern was good and there was no pattern edge hollowing-out. When this was heat treated for 30 minutes under a current of nitrogen at temperatures of 200° C., 300° C. and 400° C. respectively, a polyimide pattern of film thickness 4.5 microns was obtained.

Example 13

When varnishes A and G were blended in the weight ratio 25:75 and the viscosity measured, it was 47 poise. The composition obtained was spin coated onto a silicon wafer with the rotation rate adjusted so that the film thickness after curing for 2 hours at 350° C. under a current of nitrogen was 4 microns and then, after drying under reduced pressure for 10 hours at 30° C., measurement of the infrared spectrum was carried out. Selecting the peak shown at 1750–1800 cm$^{-1}$ as a peak arising from the imide groups, when the absorbance at this wave number was measured it was 0.0407. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.271. From these absorbance values, when the degree of imidization of this sample was calculated using calibration equation (1), it was 0.15.

When the viscosity of this composition was measured after leaving for 6 days at room temperature (23° C.), it was 48 poise, and so, with the viscosity reduction being less than 10%, the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using a mask aligner PLA-501FA (made by Cannon), the film surface was exposed via an i-line cutting filter and a mask at exposure levels of from 100 to 700 mJ/cm$^2$ in 100 mJ/cm$^2$ steps. When this film was developed with a developer comprising NMP, xylene and water of ratio 7:2:1, a pattern of film thickness of 7 microns was obtained on the high exposure side, namely 400 mJ/cm$^2$ and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 14

When varnishes B and C were blended in the weight ratio 5:95 and the viscosity measured, it was 50 poise. The composition obtained was spin coated onto a silicon wafer with the rotation rate adjusted so that the film thickness after curing for 2 hours at 350° C. under a current of nitrogen was 4 microns, and then, after drying under reduced pressure for 10 hours at 30° C., measurement of the infrared spectrum was carried out. Selecting the peak shown at 1750–1800 cm$^{-1}$ as a peak arising from the imide groups, when the absorbance at this wave number was measured it was 0.115. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.28. From these absorbance values, when the degree of imidization of this sample was calculated using calibration equation (1), it was 0.41.

When the viscosity of this composition was measured after leaving for 6 days at room temperature (23° C.), it was 52 poise, and so, with the viscosity reduction being less than 10%, the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using a mask aligner PLA-501FA (made by Cannon), the film surface was exposed via an i-line cutting filter and a mask at exposure levels of from 100 to 700 mJ/cm$^2$ in 100 mJ/cm$^2$ steps. When this film was developed with a developer comprising NMP, xylene and water of ratio 7:2:1, a pattern of film thickness of 7 microns was obtained on the high exposure side, namely 400 mJ/cm$^2$ and above. The pattern was good and there was no pattern edge hollowing-out. When this was heat treated for 30 minutes under a current of nitrogen at temperatures of 200° C., 300° C. and 400° C. respectively, a polyimide pattern of film thickness 4.5 microns was obtained.

Example 15

When varnishes B and D were blended in the weight ratio 15:85 and the viscosity measured, it was 66 poise. The composition obtained was spin coated onto a silicon wafer with the rotation rate adjusted so that the film thickness after curing for 2 hours at 350° C. under a current of nitrogen was 4 microns and then, after drying under reduced pressure for 10 hours at 30° C., measurement of the infrared spectrum was carried out. Selecting the peak shown at 1750–1800 cm$^{-1}$ as a peak arising from the imide groups, when the absorbance at this wave number was measured it was 0.0184. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.307. From these absorbance values, when the degree of imidization of the sample was calculated using calibration equation (1), it was 0.06.

When the viscosity of this composition was measured after leaving for 6 days at room temperature (23° C.), it was 65 poise, and so, with the viscosity reduction being less than 10% the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using an i-line stepper, DSW-8500-70i (made by GCA), the film surface was exposed via a mask at exposure levels of from 100 to 700 mJ/cm$^2$ in 100 mJ/cm$^2$ steps, at 0 microns focus. When this film was developed with a developer comprising NMP, propylene glycol monomethyl ether acetate and water of ratio 9:3:2, a pattern of film thickness 7 microns was obtained on the high exposure side, namely 400 mJ/cm² and above. The pattern was good and there was no pattern edge hollowing-out. When this was heat treated for 30 minutes under a current of nitrogen at temperatures of 200° C., 300C and 400° C. respectively, a polyimide pattern was obtained.

Example 16

When varnishes B and F were blended in the weight ratio 80:20 and the viscosity measured, it was 62 poise. The composition obtained was spin coated onto a silicon wafer with the rotation rate adjusted so that the film thickness after curing for 2 hours at 350° C. under a current of nitrogen was 4 microns, and then, after drying under reduced pressure for 10 hours at 30° C., measurement of the infrared spectrum was carried out. Selecting the peak shown at 1750–1800 cm$^{-1}$ as a peak arising from the imide groups, when the absorbance at this wave number was measured it was 0.115. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.329. From these absorbance values, when the degree of imidization of this sample was calculated using calibration equation (1), it was 0.35.

When the viscosity of this composition was measured after leaving for 6 days at room temperature (23° C.), it was 60 poise, and so, with the viscosity reduction being less than 10%, the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using a mask aligner PLA-501FA (made by Cannon), the film surface was exposed via an i-line cutting filter and a mask at exposure levels of from 100 to 700 mJ/cm² in 100 mJ/cm² steps. When this film was developed with a developer comprising NMP, xylene and water of ratio 7:2:1, a pattern of film thickness 7 microns was obtained on the high exposure side, namely 400 mJ/cm²and above. The pattern was good and there was no pattern edge hollowing-out. When this was heat treated for 30 minutes under a current of nitrogen at temperatures of 200° C., 300° C. and 400° C. respectively, a polyimide pattern was obtained.

Example 17

When varnishes B and G were blended in the weight ratio 7:93 and the viscosity measured, it was 41 poise. The composition obtained was spin coated onto a silicon wafer with the rotation rate adjusted so that the film thickness after curing for 2 hours at 350° C. under a current of nitrogen was 4 microns and then, after drying under reduced pressure for 10 hours at 30° C., measurement of the infrared spectrum was carried out. Selecting the peak shown at 1750–1800 cm$^{-1}$ as a peak arising from the imide groups, when the absorbance at this wave number was measured it was 0.016. Next, this sample was cured for 2 hours at 350° C. under a current of nitrogen and 100% imidization effected. When the absorbance at the wave number (1750–1800 cm$^{-1}$) arising from the imide groups in this cured film of thickness 4 microns was determined, it was 0.267. From these absorbance values, when the degree of imidization of this sample was calculated using calibration equation (1), it was 0.06.

When the viscosity of this composition was measured after leaving for 6 days at room temperature (23° C.), it was 40 poise, and so, with the viscosity reduction being less than 10%, the stability with lapse of time was good.

This solution was spin coated onto a 4" silicon wafer and, using a hot plate SCW-636 (made by Dainippon Screen), baking was carried out for 2 minutes at 80° C. and then for 2 minutes at 95° C., and a film of 10 micron thickness obtained. Next, using an i-line stepper, DSW-8500-70i (made by GCA), the film surface was exposed via a mask at exposure levels of from 100 to 700 mJ/cm² in 100 mJ/cm² steps, at 0 microns focus. When this film was developed with a developer comprising NMP, propylene glycol monomethyl ether acetate and water of ratio 9:3:2, a pattern of film thickness 7 microns was obtained on the high exposure side, namely 400 mJ/cm² and above. The pattern was good and there was no pattern edge hollowing-out. When this was heat treated for 30 minutes under a current of nitrogen at temperatures of 200° C., 300° C. and 400° C. respectively, a polyimide pattern was obtained.

TABLE 1

| | Degree of Imidation | i-Line Transmittance (%) | Photocross-linking Groups | Exposure Wavelength | Photosensitive Performance | Viscosity (poise) before leaving | Viscosity (poise) after leaving |
|---|---|---|---|---|---|---|---|
| Example 1 | 0.1 | 6.5 | yes | i-line | good | 68 | 69 |
| Example 2 | 0.06 | 1.3 | yes | g, h line | good | 58 | 59 |
| Example 3 | 0.48 | 30 | yes | i-line | good | 42 | 41 |
| Example 4 | 0.10 | 10 | yes | i-line | good | 43 | 45 |
| Example 5 | 0.10 | 6.0 | yes | i-line | good | 56 | 54 |
| Example 6 | 0.10 | 6.0 | yes | i-line | good | 68 | 68 |
| Example 7 | 0.17 | 10 | yes | i-line | good | 85 | 83 |
| Example 8 | 0.22 | 0 | yes | g-line | good | 98.8 | 100 |
| Example 9 | 0.13 | 18 | yes | i-line | good | 85 | 83 |
| Example 10 | 0.08 | 30 | yes | i-line | good | 23 | 24 |
| Example 11 | 0.11 | — | yes | g, h line | good | 85 | 86 |
| Example 12 | 0.28 | — | yes | g, h line | good | 72 | 70 |
| Example 13 | 0.15 | — | yes | g, h line | good | 47 | 48 |
| Example 14 | 0.41 | — | yes | g, h line | good | 50 | 52 |
| Example 15 | 0.06 | — | yes | i-line | good | 66 | 65 |
| Example 16 | 0.35 | — | yes | g, h line | good | 62 | 60 |
| Example 17 | 0.06 | — | yes | i-line | good | 41 | 40 |
| Comp. Ex. 1 | 0.02 | 8.5 | yes | — | — | 68 | 54 |
| Comp. Ex. 2 | 0.02 | 2.0 | yes | — | — | 92 | 78 |
| Comp. Ex. 3 | 0.02 | 60 | yes | — | — | 136 | 102 |
| Comp. Ex. 4 | 0.02 | 40 | yes | — | — | 39 | 24 |

TABLE 1-continued

|  | Degree of Imidation | i-Line Transmittance (%) | Photocross-linking Groups | Exposure Wavelength | Photosensitive Performance | Viscosity (poise) before leaving | Viscosity (poise) after leaving |
|---|---|---|---|---|---|---|---|
| Comp. Ex. 5 | 0.06 | 1.3 | no | g, h line | X | 58 | 59 |
| Comp. Ex. 6 | 0.06 | 1.3 | no | g, h line | X | 58 | 59 |
| Comp. Ex. 7 | 0.70 | 20 | yes | i-line | X | 12 | 12.5 |

What is claimed is:

1. An actinic radiation sensitive polymer composition, comprising, (a) a polyimide precursor obtainable by the interaction of an amine compound having a photo-crosslinking group with carboxyl groups of a poly(amic acid), and (b) a photoinitiator and/or photosensitizer, wherein the polyimide precursor has a degree of imidization Ia of $0.03 \leq Ia \leq 0.6$ and the polymer composition has a transmittance at a wavelength of 365 nm of at least 2% and no more than 40% through a 10 micron thick film of the polymer composition.

2. An actinic radiation sensitive polymer composition according to claim 1, wherein the polyimide precursor (a) is obtainable by reaction of a polymer comprising structural units represented by general formula (1)

(1)

and additionally comprising structural units represented by general formulae:

(2)

and/or (3)

where $R^1$ is a 3- or 4-valent organic group with at least two carbon atoms, $R^2$ is a divalent organic group with at least 2 carbon atoms and k is 0 or 1, with from 0.4 to 5 molar equivalents in terms of the carboxyl groups in the polymer of an amine compound represented by general formula (4)

(4)

where $R^3$, $R^4$ and $R^5$ independently each represent hydrogen or an organic group with from 1 to 30 carbons, of which at least one is an organic group with a photo-crosslinking group.

3. An actinic radiation sensitive polymer composition according to claim 2, obtainable by reaction of the said polymer with from 1 to 5 molar equivalents in terms of the carboxyl groups in the polymer of the amine compound represented by general formula (4).

4. An actinic radiation sensitive polymer composition according to claim 2, wherein at least 15 mol % of $R^1$ in general formulae (1), (2) and/or (3) comprises the residual group of pyromellitic acid.

5. An actinic radiation sensitive polymer composition according to claim 2, wherein from 3 to 20 mol % of $R^2$ in general formulae (1), (2) and/or (3) comprises the residual group of a diamine containing an aliphatic group which has siloxane bonding.

6. An actinic radiation sensitive polymer composition according to claim 2, wherein at least 20 mol % of $R^2$ in general formulae (1), (2) and/or (3) is represented by at least one diamine residual group selected from general formulae (6) and (7)

(6)

$Y^1$, $Y^2$ and $Y^3$ independently represent —O—, —S—, —CH$_2$—, —C(CH$_3$)$_2$—, —C(CF$_3$)$_2$—, —SO$_2$— or a single bond (7)

$R^6$ and $R^7$ independently represent CH$_3$—, CF$_3$—, C$_2$H$_5$—, C$_2$F$_5$—, (CH$_3$)$_3$C—, F, CH$_3$O— or a phenyl group).

7. An actinic radiation sensitive polymer composition according to claim 1, wherein the degree of imidization Ia is $0.06 \leq Ia \leq 0.5$.

8. An actinic radiation sensitive polymer composition according to claim 4, wherein the degree of imidization Ia is $0.08 \leq Ia \leq 0.4$.

9. An actinic radiation sensitive polymer composition according to claim 5, wherein the degree of imidization Ia is $0.1 \leq Ia \leq 0.35$.

10. An actinic radiation sensitive polymer composition according to claim 1, wherein the said transmittance of the said prebake film is no more than 30%.

11. An actinic radiation sensitive polymer composition according to claim 10, wherein the said transmittance of the said prebake film is at least 4% but no more than 30%.

12. An actinic radiation sensitive polymer composition according to claim 11, wherein the said transmittance of the said prebake film is no more than 20%.

13. An actinic radiation sensitive polymer composition according to claim 12, wherein the said transmittance of the said prebake film is no more than 15%.

14. A method of preparing a polyimide precursor composition for an actinic radiation sensitive polymer composition, which method comprises reacting a poly (amic acid) radiation sensitive polymer composition, which method comprises reacting a poly (amic acid) having carboxyl groups with an amine compound having a photo-crosslinkable group at 50 to 90° C. for 1 to 12 hours characterized in that the polyimide precursor has a degree of imidization of $0.03 \leq Ia \leq 0.6$.

15. A method according to claim 14, which comprises mixing the polyamide precursor with at least one of a photoinitiator and photosensitizer to obtain the actinic radiation sensitive polymer composition.

* * * * *